(12) United States Patent
Gherman (10) Patent No.: US 10,990,477 B2
(45) Date of Patent: Apr. 27, 2021

(54) DEVICE AND METHOD FOR CONTROLLING THE DATA REFRESH CYCLES IN REPROGRAMMABLE NON-VOLATILE MEMORIES

(71) Applicant: COMMISSARIAT A L'ENERGIE ATOMIQUE ET AUX ENERGIES ALTERNATIVES, Paris (FR)

(72) Inventor: Valentin Gherman, Palaiseau (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/756,837

(22) PCT Filed: Oct. 1, 2018

(86) PCT No.: PCT/EP2018/076565
§ 371 (c)(1),
(2) Date: Apr. 16, 2020

(87) PCT Pub. No.: WO2019/076613
PCT Pub. Date: Apr. 25, 2019

(65) Prior Publication Data
US 2020/0264952 A1    Aug. 20, 2020

(30) Foreign Application Priority Data

Oct. 18, 2017    (FR) ...................................... 1759765

(51) Int. Cl.
*G11C 29/00* (2006.01)
*G06F 11/10* (2006.01)
*G11C 16/34* (2006.01)

(52) U.S. Cl.
CPC ...... *G06F 11/1068* (2013.01); *G11C 16/3418* (2013.01); *G11C 16/3495* (2013.01)

(58) Field of Classification Search
CPC ............. G06F 11/1068; G11C 16/3418; G11C 16/3495
See application file for complete search history.

(56) References Cited

U.S. PATENT DOCUMENTS

| 9,330,767 B1 | 5/2016 | Steiner et al. | |
| 2009/0161466 A1* | 6/2009 | Hamilton | G11C 16/10 365/222 |

(Continued)

OTHER PUBLICATIONS

Meza, et al., "A Large-Scale Study of Flash Memory Failures in the Field", ACM SIGMETRICS International Conference on Measurement and Modeling of Computer System, pp. 177-190, 2015.

*Primary Examiner* — Samir W Rizk
(74) *Attorney, Agent, or Firm* — BakerHostetler (57) ABSTRACT

A method for controlling the refresh of data in reprogrammable nonvolatile memories includes a plurality of memory pages for storing data. The method performs the steps of: identifying with an error correction code errors in a read memory page; computing among the identified errors the number of retention errors and of non-retention errors, the non-retention errors especially comprising repeated read or programming errors; computing the retention age of the read memory page; estimating the remaining retention time for the read memory page depending on the parameters number of retention errors, number of non-retention errors and retention age computed beforehand; comparing the estimated value of the remaining retention time to a predefined value corresponding to a maximum time interval between two successive operations of reading a memory page; and determining whether the read memory page must be refreshed or not depending on the results of the comparison determining whether the page must be refreshed or not depending on the estimated value of the remaining retention time.

21 Claims, 6 Drawing Sheets

(56) References Cited

U.S. PATENT DOCUMENTS

| | | |
|---|---|---|
| 2013/0132652 A1 | 5/2013 | Wood et al. |
| 2016/0110125 A1 | 4/2016 | Orme et al. |
| 2016/0118137 A1 | 4/2016 | Zhang |
| 2016/0179406 A1 | 6/2016 | Gorobets et al. |

* cited by examiner

FIG.6

DEVICE AND METHOD FOR CONTROLLING THE DATA REFRESH CYCLES IN REPROGRAMMABLE NON-VOLATILE MEMORIES

CROSS-REFERENCE TO RELATED APPLICATIONS

This application is a National Stage of International patent application PCT/EP2018/076565, filed on Oct. 1, 2018, which claims priority to foreign French patent application No. FR 1759765, filed on Oct. 18, 2017, the disclosures of which are incorporated by reference in their entirety.

FIELD OF THE INVENTION

The invention relates to the field of nonvolatile memories and in particular concerns the retention time and refresh cycles of data stored in reprogrammable nonvolatile memories.

BACKGROUND

Nonvolatile memories (NVMs) have the capability of being able to keep their data after being powered down. Reprogrammable nonvolatile memories have the capability of being able to keep their data after being powered down, while allowing the data to be reprogrammed by the user. One example is flash memory the uses of which are many, e.g. in digital cameras, cell phones, printers, personal digital assistants (PDAs), or devices for reading and recording audio such as digital audio players and USB keys. Flash memories form the storage infrastructure in the electronic discs known as solid-state drives (SSDs), which are intended to replace the conventional hard disks known as hard disk drives (HDDs).

An SSD may contain tens of flash memories. A flash memory is divided into thousands of blocks. Each block may contain about one hundred pages each containing thousands or tens of thousands of bits. Certain SSD use multi-level-cell (MLC) flash memories allowing 2 bits to be stored per memory cell or triple-level-cell (TLC) flash memories allowing 3 bits to be stored per memory cell, instead of 1 bit per memory cell as in single-level-cell (SLC) flash memories. Setting aside the increase in the etching fineness, the fact of storing a plurality of bits per cell allows data storage density to be increased and the difference in price per gigabyte (GB) between SSDs and HDDs to be decreased.

However, the improvement in storage density affects the retention time of the data stored in the memory cells, i.e. the time corresponding to the time period for which data is guaranteed to be preserved, and affects the endurance of flash memories, which is generally measured in number of guaranteed program/erase (P/E) cycles. For example, the endurance of a flash memory is decreased by a factor of ten on average for each additional bit stored in the memory cells. The limited retention of the data is due to the appearance of retention errors, the number of which increases with age, i.e. the time that has passed since the data were programmed.

It is possible to use more powerful error correction codes (ECC) with more check bits and a greater correction capability to increase the retention time of the data.

Periodically refreshing the data also allows the effects of the decrease in endurance and in retention time to be reduced. The data may be refreshed without changing the location where they are stored, i.e. just by injecting the amount of charge that is lacking onto the floating gate of the flash cells. Alternatively, the refresh may be achieved by rewriting the data, the data being reprogrammed in another physical location.

However, one drawback of such known approaches is that they are tailored for "worst-case" situations and do not take into account the variations in error rate that may be seen from one memory to another, from one block to another inside a given memory, or from one page to another inside a given block. Thus, for example, a large-scale study of the SSDs of a data center has shown that a relatively small number of SSDs contributes to a decrease in the overall error rate (J. Meza et al., "A large-scale study of flash memory failures in the field," ACM SIGMETRICS International Conference on Measurement and Modeling of Computer System, pp. 177-190, 2015). The SSDs that cause this "worst-case" situation require a set refresh frequency suitable for the error rate of these worst-case SSDs. However, this refresh frequency is too pessimistic for the other SSDs.

Patent application USA 2016/179406 A1 by Gorobets Sergey Anatolievich et al. proposes a first method for measuring and analyzing memory cells that independently measures/predicts memory wear/endurance, data retention (DR), read disturb and/or remaining margin, by constructing and analyzing histograms of the distribution of the states of the individual voltage levels of the cells. Preventative actions based on these measurements may be taken to improve the management of the memory and data. A second method proposed in this document allows a deterioration in DR to be predicted based on a measurement of the slope of the increase in the bit error rate (BER) over time. This second method requires each memory location that must be analyzed to be read multiple times and the results of these reads to be stored, because it is possible to make the estimations only after relatively long time intervals.

Thus, there is a need for a way to improve data retention time and memory endurance that avoids the use of more powerful correction codes. There is a need for a way to improve data retention time and memory endurance that adapts the data refresh cycles to the error rate of each SSD, memory, memory block or memory page, and that does not employ cycles tailored to the worst-case for the whole of a population of nonvolatile memories or SSDs able to contain units subject to more errors than others.

The present invention meets this need.

SUMMARY OF THE INVENTION

One object of the present invention is to provide a method and associated device allowing data refresh frequency to be controlled.

The method allows a remaining retention time to be estimated for each page of a nonvolatile memory, depending on the number of retention errors and on the retention age of the page.

Advantageously, a memory page containing valid data is refreshed only if the remaining retention time is shorter than the time remaining until the next access to this memory page.

To obtain the sought-after results, methods such as claimed are proposed. In particular, a method is provided for controlling the refresh of data in reprogrammable nonvolatile memories, said memories comprising a plurality of memory pages for storing data, the steps of the method being executed during an operation of reading a memory page and comprising:

identifying with an error correction code errors in a read memory page;

computing among the identified errors the number of retention errors and of non-retention errors, the non-retention errors especially comprising repeated read or programming errors;

computing the retention age of said read memory page;

estimating the remaining retention time for said read memory page depending on the parameters number of retention errors, number of non-retention errors and retention age computed beforehand;

comparing the estimated value of the remaining retention time to a predefined value corresponding to a maximum time interval between two successive operations of reading a memory page; and determining whether said read memory page must be refreshed or not depending on the results of the comparison.

According to embodiments:

the step of determining whether to refresh the page consists in determining that the page must be refreshed if the remaining retention time is below the predefined value;

the step of estimating the remaining retention time comprises at least one step consisting in using a statistical distribution on the parameters number of retention errors, number of non-retention errors and retention age;

the statistical distribution is the chi-squared distribution;

the step of estimating the remaining retention time comprises at least a step consisting in obtaining a value of a maximum tolerated number of retention errors for said page; the comparing step consists in comparing the maximum tolerated number of retention errors to the computed number of retention errors; and the step of determining whether to refresh consists in determining that said page must be refreshed if the computed number of retention errors is above the maximum tolerated number of retention errors;

the maximum tolerated number of retention errors corresponds to the highest value of the number of retention errors for which the remaining retention time is above said predefined value;

the step of estimating the remaining retention time consists in obtaining a value of a minimum tolerated retention age for said page; the comparing step consists in comparing the minimum tolerated retention age to the computed retention age; and the step of determining whether to refresh consists in determining that said page must be refreshed if the computed retention age is below the minimum tolerated retention age;

the minimum tolerated retention age corresponds to the lowest retention age for which the remaining retention time is above said predefined value;

the step of estimating the remaining retention time consists in reading a table of values precomputed for combinations of the parameters number of retention errors, number of non-retention errors and retention age, and consists in selecting a stored value for the number of retention errors, the number of non-retention errors and the retention age computed for said page;

the selected value is a remaining retention time;

the selected value is a maximum tolerated number of retention errors;

the selected value is a minimum tolerated retention age;

the table of precomputed values contains binary values representative of results of the comparison of the remaining retention time with said predefined value, or of results of the comparison of the number of retention errors with the maximum tolerated number of retention errors, or of results of the comparison of retention age with the minimum tolerated retention age;

the step of computing the retention age of said at least one memory page consists in reading a timestamp associated with said page and in taking the difference between the state of a counter having provided timestamps to the memory pages and the timestamp read for said page.

The invention also covers a device for controlling the refresh of data in reprogrammable nonvolatile memories, said memories comprising a plurality of memory pages for storing data, the device comprising means for implementing the claimed method in its various embodiments. In particular, the device comprises:

an error correction code having a predefined error correction capability;

a circuit for identifying, with the error correction code, errors made during the storage of data in a memory page;

a circuit suitable for computing, among identified errors, the number of retention errors and of non-retention errors in said memory page, the non-retention errors especially comprising repeated read or programming errors;

a circuit suitable for computing the retention age of said memory page;

a circuit suitable for estimating the remaining retention time for said memory page depending on the parameters number of retention errors, number of non-retention errors and retention age computed beforehand;

a circuit suitable for comparing the estimated value of the remaining retention time to a predefined value corresponding to a maximum time interval between two successive operations of reading a memory page; and a circuit suitable for determining whether said memory page must be refreshed or not depending on the result of the comparison.

In one embodiment, the device in addition comprises a circuit suitable for refreshing said page.

The invention also relates to a system for storing data comprising at least one reprogrammable nonvolatile memory having a plurality of memory pages for storing data, and at least one device such as claimed for controlling the refresh of data in said at least one reprogrammable nonvolatile memory.

In one embodiment, the claimed device is integrated into a controller suitable for managing the read and write operations of a plurality of memory pages.

The invention also relates to a computer program that contains code instructions for executing the method for controlling the refresh of data in reprogrammable nonvolatile memories such as claimed. The invention may be available on a processor-readable storage medium on which a program containing instructions for executing the claimed method is stored.

BRIEF DESCRIPTION OF THE DRAWINGS

Various aspects and advantages of the invention will become apparent on reading the description of the preferred but nonlimiting modes of implementation of the invention, with reference to the following figures.

DETAILED DESCRIPTION

Figure 1:
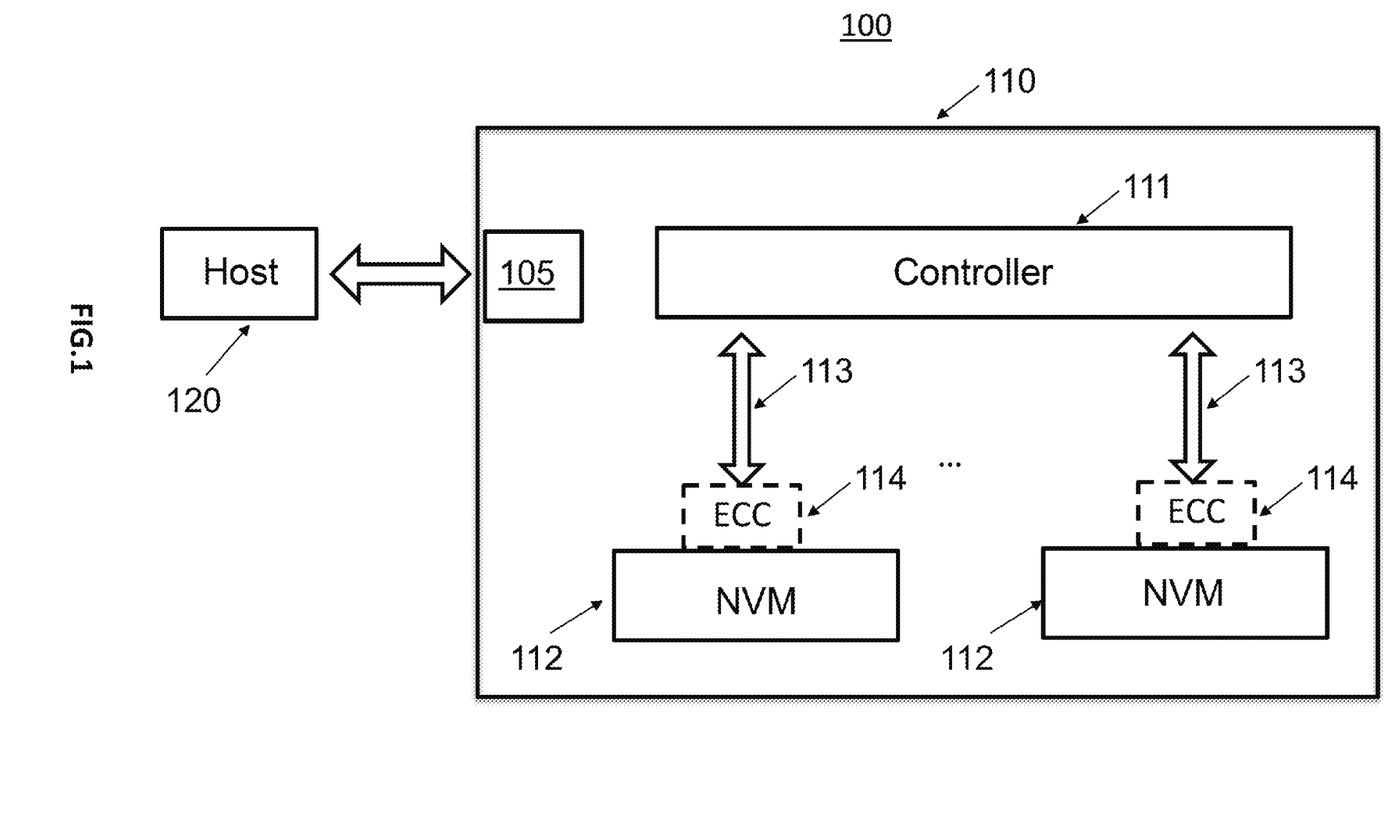
FIG. 1 shows a block diagram of a host and of a memory card or SSD allowing the device of the invention to be implemented.

FIG. 1 schematically shows a host 120 coupled to a storage system 110 allowing the device of the invention to be implemented. The storage system 110 may for example be an SSD or a memory card. In the described example, the storage system 110 is shown as comprising a plurality of nonvolatile memories 112. In one variant of implementation, the storage system comprises a single NVM. The storage system 110 also comprises connection interfaces 105 for connecting it to the host. As is well known to those skilled in the art, such interfaces may be universal-serial-bus (USB) connectors or even serial-advanced-technology-attachment (SATA) connectors. The storage system 110 may thus be connected via the connector to the corresponding interface of the host 120 with a view to exchange of data using various protocols, such as the USB and SATA protocols or other protocols more specific to the host.

In one variant embodiment, the storage system 110 may be a card integrated into a host system, the host being able moreover to accommodate one or more memory cards. According to another mode of implementation, the host 120 and the storage system 110 are in wireless communication and exchange data using Wi-Fi protocols (Wi-Fi being the acronym of wireless fidelity).

The host may be any system that is able to contain memory cards or SSDs or to exchange data with memory cards or SSDs. Thus, nonlimitingly, the host 120 may be a desktop, laptop or tablet computer, a cell phone, a smart phone or any other type of personal digital assistant. The host may also be a server and comprise receptacles for accommodating one or more memory cards or SSDs. The host may also be a microcontroller or a processor integrated into the same chip as the storage system 110.

The storage system 110 comprises a control circuit 111 comprising components that are well known to those skilled in the art and that allow exchanges of data and instructions between the NVMs 112 and the host 120 via host/memory communication interfaces and read/write operations and the correction of errors in the memories via error correction codes to be managed. The control circuit 111 may be an SSD controller or a memory-card controller. In one embodiment, the controller 111 may be implemented as a microcontroller. In another embodiment, all of the components of the control circuit may be implemented as a dedicated module such as an application-specific integrated circuit (ASIC).

In one embodiment, the nonvolatile memories 112 may be flash memories. In one variant, the NVMs may be emergent resistive memories such as PCRAMs (phase-change random access memories (RAMs)), CBRAMs (conductive-bridging RAMs) or MRAMs (magnetic RAMs).

The NVMs 112 of the storage system may be integrated into separate chips or incorporated with the controller 111 into the same chip. Error correction circuits (ECCs) 114 may be associated with the NVMs in order to correct errors made during the storage of data.

The controller 111 is coupled to the NVMs 112 via communication channels or buses 113. According to embodiments, one bus may be connected to a plurality of NMVs.

Figure 2:
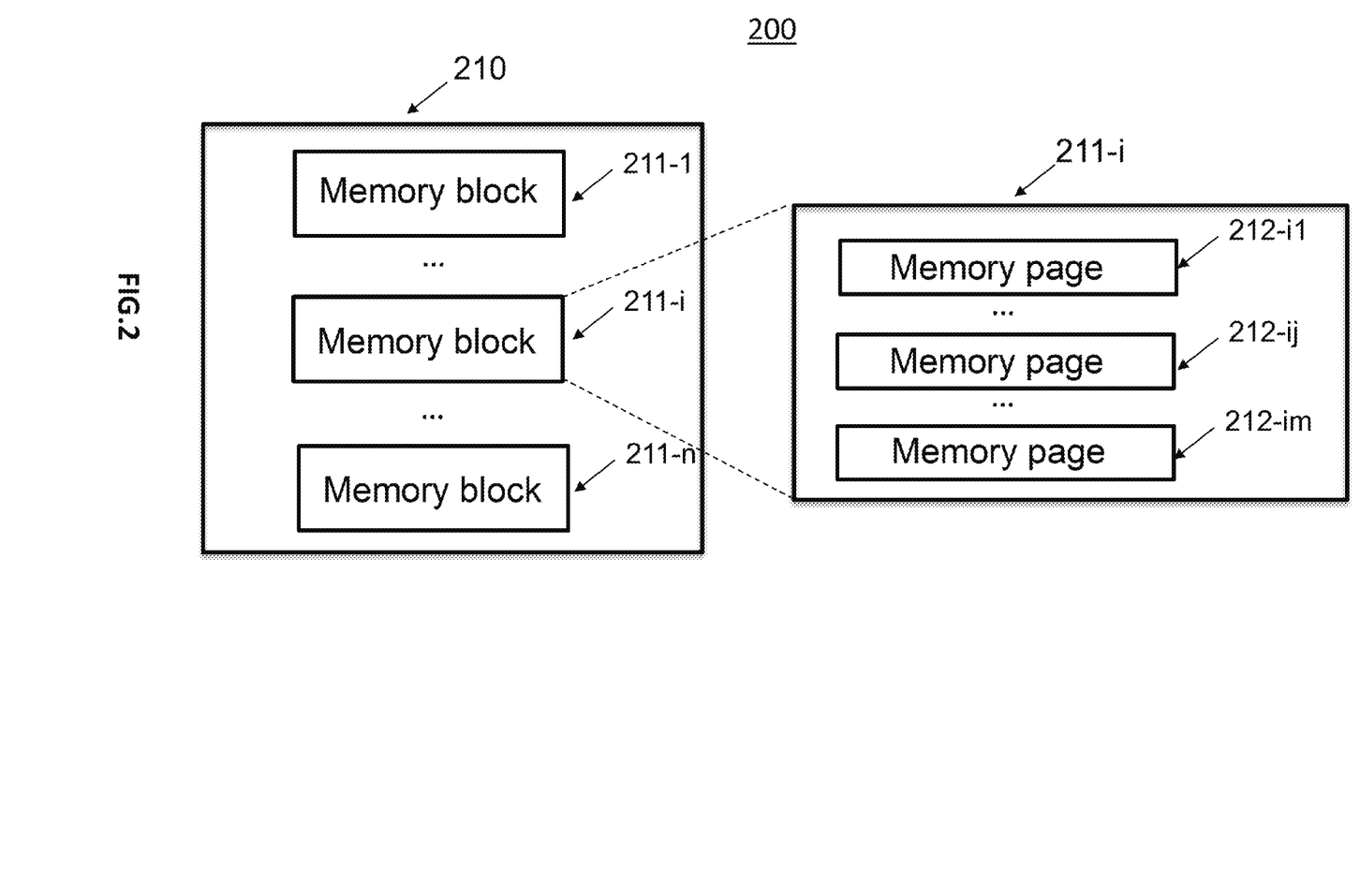
FIG. 2 shows the internal structure of a nonvolatile memory in one embodiment.

FIG. 2 shows the internal structure of a nonvolatile memory allowing the method of the invention to be performed. An NMV 210 may contain one or more memory blocks 211-i, each memory block 211-i containing one or more memory pages 212-ij. It is common for a memory block to contain hundreds of pages. The pages of a memory block are written to one after the other.

A memory page contains data bits relative to data accessible to the user and redundant data bits that may be used in the correction of errors or in the management of data carried out by the controller.

The bits of a memory page are programmed and read simultaneously. In the case of a flash NMV, all the bits of a memory block are erased at the same time in order to allow them to be reprogrammed. A write operation may correspond to a programming operation or to an erasing operation followed by a programming operation.

The general principle of the invention is based on an estimation of the remaining retention time for each page of a nonvolatile memory, depending on the number of errors in the page and on its retention age. The method of the invention, which allows the refresh of data in reprogrammable nonvolatile memories comprising a plurality of memory pages for storing data to be controlled, will consist in computing the number of retention errors and of non-retention errors in at least one memory page; in computing the retention age of said at least one memory page; in estimating the remaining retention time for said page depending on the parameters computed beforehand; and in determining whether the page must be refreshed or not depending on the estimated value of the remaining retention time.

In particular, a memory page with valid data will be refreshed only if the remaining retention time is shorter than the time until the next access to this memory page, a maximum time interval between two successive read operations of a memory page being predefined.

Thus, the refresh frequency of the pages depends on the actual error rate that affects these pages, and is not necessarily correlated to the frequency at which these memory pages are read. Advantageously, since a read operation can be much faster than a refresh operation, the impact on the performance of a storage system may be substantially decreased.

Moreover the refresh probability of a page becomes negligible when the errors can be managed with the available correction code, even for the longest guaranteed retention times.

Figure 3:
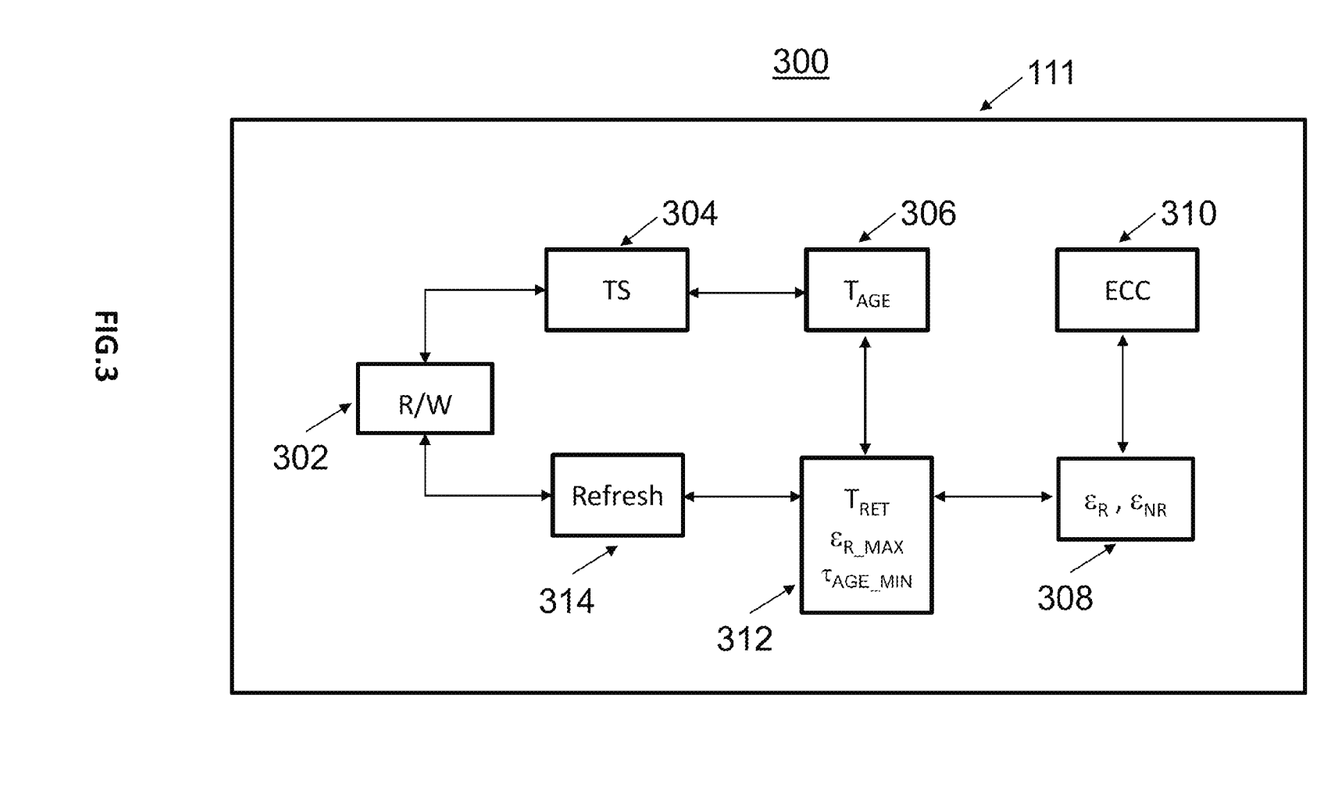
FIG. 3 shows a block diagram of the device of the invention according to one embodiment.

FIG. 3 shows a block diagram of the device 300 of the invention according to one embodiment. The device may be implemented in the controller 111 or in dedicated hardware, such as for example a microcontroller or an ASIC added or coupled to the storage system 110. The device comprises a read/write module 302 for accessing the memory pages, which may be that of the controller 111.

A counter 304 allows a timestamp to be assigned to each memory block during the first programming operation (after an operation of erasing or resetting the block). The timestamp TS associated with each memory block is taken into account to evaluate the retention age $\tau_{AGE}$ of the stored bits. In an alternative embodiment, a timestamp may be assigned to each page.

The device comprises a computing module 306 that allows the retention age $\tau_{AGE}$ of all of the bits stored in a memory block to be computed. Advantageously, as timestamps are assigned at the memory-block level to avoid an increased storage cost, the method of the invention makes it possible to decide to refresh data at the level of each memory page of the memory block. Specifically, the method takes into account the number of errors in each page when deciding whether to refresh the page or not.

The device comprises an error correction circuit 310 (ECC) that allows the errors made during the storage of data in a page to be identified and corrected using an error correction code. The ECC has a predefined error correction capability.

The device comprises a module 308 for counting errors or decoding errors that allows the errors present on a page to be counted, and retention errors $\varepsilon_R$ to be differentiated from other types of errors, such as programming or read errors, these other types of errors being called non-retention errors $\varepsilon_{NR}$ below. In one embodiment, the error decoder and the error corrector are one and the same circuit.

The device in addition comprises a module 312 for estimating remaining retention time, which allows a remaining retention time $T_{RET}$ to be obtained or computed from the parameters number of retention errors, number of non-retention errors and retention age.

In one embodiment, the estimating module comprises computing means allowing an estimation of the remaining time to be computed online. In another embodiment, the module for estimating retention time consists of a table comprising precomputed values of remaining retention time. The stored values are computed off-line for various combinations of the parameters "number of retention errors/ number of non-retention errors/retention age".

In another variant embodiment, the module for estimating retention time allows values of the maximum tolerated number of retention errors $\varepsilon_{R\_MAX}$ to be obtained or stored for various combinations of the parameters "number of non-retention errors/retention age".

In another variant embodiment, the module for estimating remaining retention time allows values of the minimum tolerated retention age $\tau_{AGE\_MIN}$ to be obtained or stored for various combinations of the parameters "number of retention errors/number of non-retention errors".

A deciding module 340 makes it possible to determine whether a page must be refreshed, depending of the result produced by the estimating module 312.

Figure 4:
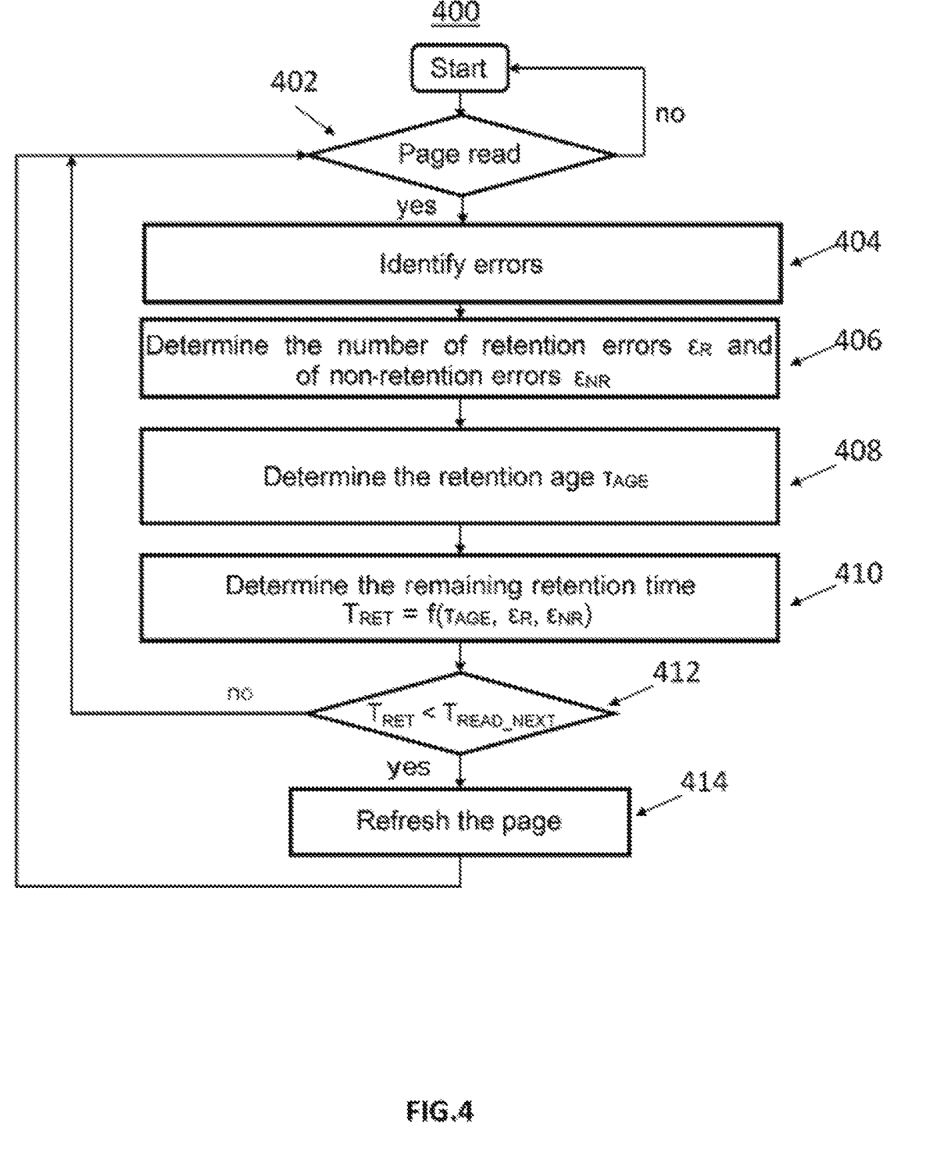
FIG. 4 illustrates a sequence of steps of the method of the invention according to one embodiment.

FIG. 4 illustrates a sequence of steps of the method 400 allowing it to be determined whether data stored in a page of a nonvolatile memory must be refreshed. The method 400 starts with an operation 402 of reading a page in an NMV. The read operation may be triggered on a request received from the host 120 or on an operation initiated by the controller 111, for example during the management of the data stored in the storage system.

While the page is being read, errors that were made during the prior storage of the data in the page are identified. Certain of these errors may be corrected using a correction code (step 404).

The following step 406 consists in counting, among the identified errors, the number of retention errors $\varepsilon_R$ and of non-retention errors $\varepsilon_{NR}$. In one embodiment, the steps of counting errors and of correcting errors may be carried out simultaneously. In the case where the nonvolatile memory is an SLC flash memory, the errors are differentiated by comparing the read values and the corrected values. In such a memory, a bit is affected by a retention error if the read value is 1 and the corrected value is 0. In the case where the read value is 0 and the corrected value is 1, it is a question of a non-retention error. In the case of an SLC PCRAM, a bit is affected by a retention error if the read value is 0 and the corrected value is 1. Step 406 allows the number of retention errors $\varepsilon_R$ and the number of non-retention errors $\varepsilon_{NR}$ affecting the read page to be obtained.

The method continues with a step 408 of determining the retention age $\tau_{AGE}$ of the read page. In one embodiment, the retention age is obtained by taking the difference between the state of the counter having provided a stamp to the memory block hosting the read page and the current timestamp associated with the read page.

In a following step 410, the method allows the remaining retention time $T_{RET}$ to be determined depending on the parameters obtained in the preceding steps, namely the retention age $\tau_{AGE}$, the number of retention errors $\varepsilon_R$ and the number of non-retention errors $\varepsilon_{NR}$. In one embodiment, values of the remaining retention time $T_{RET}$ are computed beforehand off-line for a plurality of combinations of the parameters "retention age $\tau_{AGE}$, number of retention errors $\varepsilon_R$, number of non-retention errors $\varepsilon_{NR}$". The values are stored as metadata in a dedicated table of the storage system (estimation table), which is accessed online when a page is read. It will be noted that the error-number parameters $\varepsilon_R$ and $\varepsilon_{NR}$ are discrete, whereas the retention-age parameter $\tau_{AGE}$ is continuous and may therefore take an infinity of values. Thus, in order to decrease the cost of storage of the table of the precomputed values of the remaining retention time $T_{RET}$, one variant embodiment consists in considering only discrete values of the retention age $\tau_{AGE}$, a step $\tau_{AGE\_STEP}$ equal to $T_{RET}$ or to a fraction (e.g. ½, ⅓, etc.) of $T_{RET}$ being used for this purpose. The value of the remaining retention time $T_{RET}$ that will correspond to a given value of the retention age $\tau_{AGE}$ is then sought in the table using an index corresponding to the integer portion of the ratio $\tau_{AGE}/\tau_{AGE\_STEP}$.

Advantageously, the estimation of the remaining retention time $T_{RET}$ is computed using a statistical distribution. In one embodiment, the computation consists in using the chi-squared ($\chi^2$) distribution, which it is known to use to compute the mean time to failure of any given product, on the parameters number of retention errors and retention age. A person skilled in the art might consider using any computation of the mean time to failure of a product depending on the test time, on the number of samples tested and on the number of samples that did not pass the test.

To estimate the retention time, the statistical distribution that gives the variation in the number of retention errors with retention age may be known, without necessarily knowing all the parameters that govern this distribution.

In one embodiment, the non-retention errors, the number of which may increase with the retention age of the memory block, such as errors due to repeated reads from a completely programmed memory, are neglected with respect to the retention errors.

In the following step 412, the method allows the remaining retention time $T_{RET}$ (which was computed online or obtained from the table of precomputed values) to be compared to a predefined value $T_{READ\_NEXT}$ corresponding to a maximum time interval between two successive operations of reading a memory page. The value $T_{READ\_NEXT}$ may be defined depending on the size of the storage system, on computation capability, on dead times, and on the application in question. Such a value may be in a range extending from a few weeks to a few months for example.

A remaining retention time $T_{RET}$ lower than $T_{READ\_NEXT}$ means that the number of errors that will be accumulated until the next read operation risks becoming uncorrectable, given the capability of the ECC. The method then allows (yes branch) a refresh of the page to be launched (step 414). After the refresh operation, the method returns to the start.

A remaining retention time $T_{RET}$ higher than $T_{READ\_NEXT}$ means that there is no need for a refresh of the data, and the method returns to the start (no branch).

In one embodiment, in order to decrease the cost of the storage of the table, each entry of the table may directly contain the result of the comparison of a remaining retention time $T_{RET}$ with $T_{READ\_NEXT}$, i.e. the table may contain a single bit per entry, instead of containing the values of $T_{RET}$, requiring a plurality of bits per entry.

In another variant embodiment, the cost of the storage of the table may be further decreased, by taking into account the fact that the remaining retention time $T_{RET}$ is a decreasing function of the variable $\varepsilon_R$ for any combination of the variables $\tau_{AGE}$ and $\varepsilon_{NR}$. It is thus possible to store, in the table, for each combination of the parameters $\tau_{AGE}$ and $\varepsilon_{NR}$, a parameter $\varepsilon_{R\_MAX}$ corresponding to the maximum number of retention errors that may still be tolerated until the next read of the memory page without exhausting the correction capability of the ECC. For each combination of the parameters retention age $\tau_{AGE}$ and number of non-retention errors $\varepsilon_{NR}$, the value of the maximum tolerated number of retention errors $\varepsilon_{R\_MAX}$ then corresponds to the highest value of the parameter number of retention errors $\varepsilon_R$ for which the remaining retention time $T_{RET}$ is above the predefined value of $T_{READ\_NEXT}$.

This variant allows a table in 2 dimensions that are indexed with the values of the parameters $\tau_{AGE}$ and $\varepsilon_{NR}$ to be stored, in contrast to the variant in which the stored table is in 3 dimensions that are indexed with the values of the parameters $\tau_{AGE}$, $\varepsilon_R$ and $\varepsilon_{NR}$.

Figure 5:
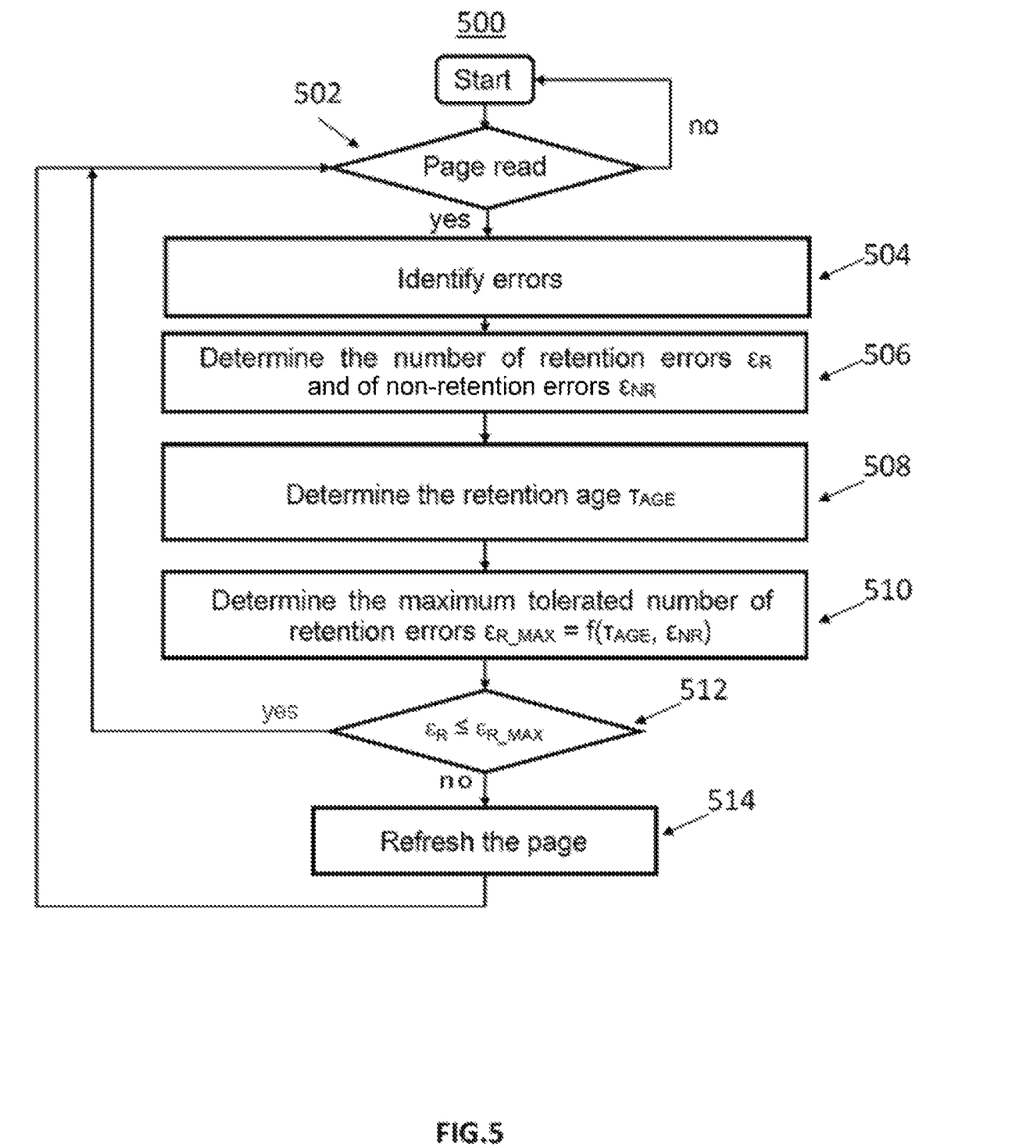
FIG. 5 illustrates a sequence of steps of the method of the invention according to one variant embodiment.

FIG. 5 illustrates a sequence of steps 500 of the method of the invention in a variant embodiment of use of the parameter maximum tolerated retention errors $\varepsilon_{R\_MAX}$. The method starts with steps 502 to 508 that are identical to steps 402 to 408 of the method of FIG. 4. They are not described again.

In the following step 510, the method allows a maximum tolerated number of retention errors $\varepsilon_{R\_MAX}$ to be obtained for a page. The value of $\varepsilon_{R\_MAX}$ may be computed online or preferably it may be obtained from the estimation table of the maximum tolerated number of retention errors. The selected value is that corresponding to a value stored, for the parameters retention age $\tau_{AGE}$ and number of non-retention errors $\varepsilon_{NR}$ than those computed, with a remaining retention time corresponding to that computed, that is higher than the maximum time interval ($T_{RET} > T_{READ\_NEXT}$).

In the following step 512, the method allows the number of retention errors $\varepsilon_R$ that was obtained following decoding by the ECC of the page, to be compared to the maximum tolerated number of retention errors $\varepsilon_{R\_MAX}$.

A number of retention errors $\varepsilon_R$ above the maximum tolerated number of retention errors $\varepsilon_{R\_MAX}$ means that the number of errors that may be accumulated until the next operation of reading the page risks becoming uncorrectable. The method then allows the page to be refreshed (step 514). After the refresh operation, the method returns to the start.

A number of retention errors $\varepsilon_R$ lower than or equal to the maximum tolerated number of retention errors $\varepsilon_{R\_MAX}$ means that there is no need for a refresh of the data, and the method returns to the start (yes branch).

In another variant embodiment, the cost of the storage of the table may also be decreased by taking into account the fact that the remaining retention time $T_{RET}$ is an increasing function relatively to the variable retention age $\tau_{AGE}$, for any combination of the variables $\varepsilon_R$ and $\varepsilon_{NR}$. It is thus possible to store, in the table, for each combination of the parameters $\varepsilon_R$ and $\varepsilon_{NR}$, a parameter $\tau_{AGE\_MIN}$ corresponding to the minimum retention age for which a number of retention errors $\varepsilon_R$ and a number of non-retention errors $\varepsilon_{NR}$ may be tolerated. Thus, for each combination of the parameters $\varepsilon_R$ and $\varepsilon_{NR}$, the value of the minimum tolerated retention age $\tau_{AGE\_MIN}$ corresponds to the lowest retention age $\tau_{AGE}$ for which the remaining retention time $T_{RET}$ is above the predefined value of $T_{READ\_NEXT}$.

This variant allows a table in 2 dimensions that are indexed with the values of the parameters $\varepsilon_R$ and $\varepsilon_{NR}$ to be stored, in contrast to the variant in which the stored table is in 3 dimensions that are indexed with the values of the parameters $\tau_{AGE}$, $\varepsilon_R$ and $\varepsilon_{NR}$.

Figure 6:
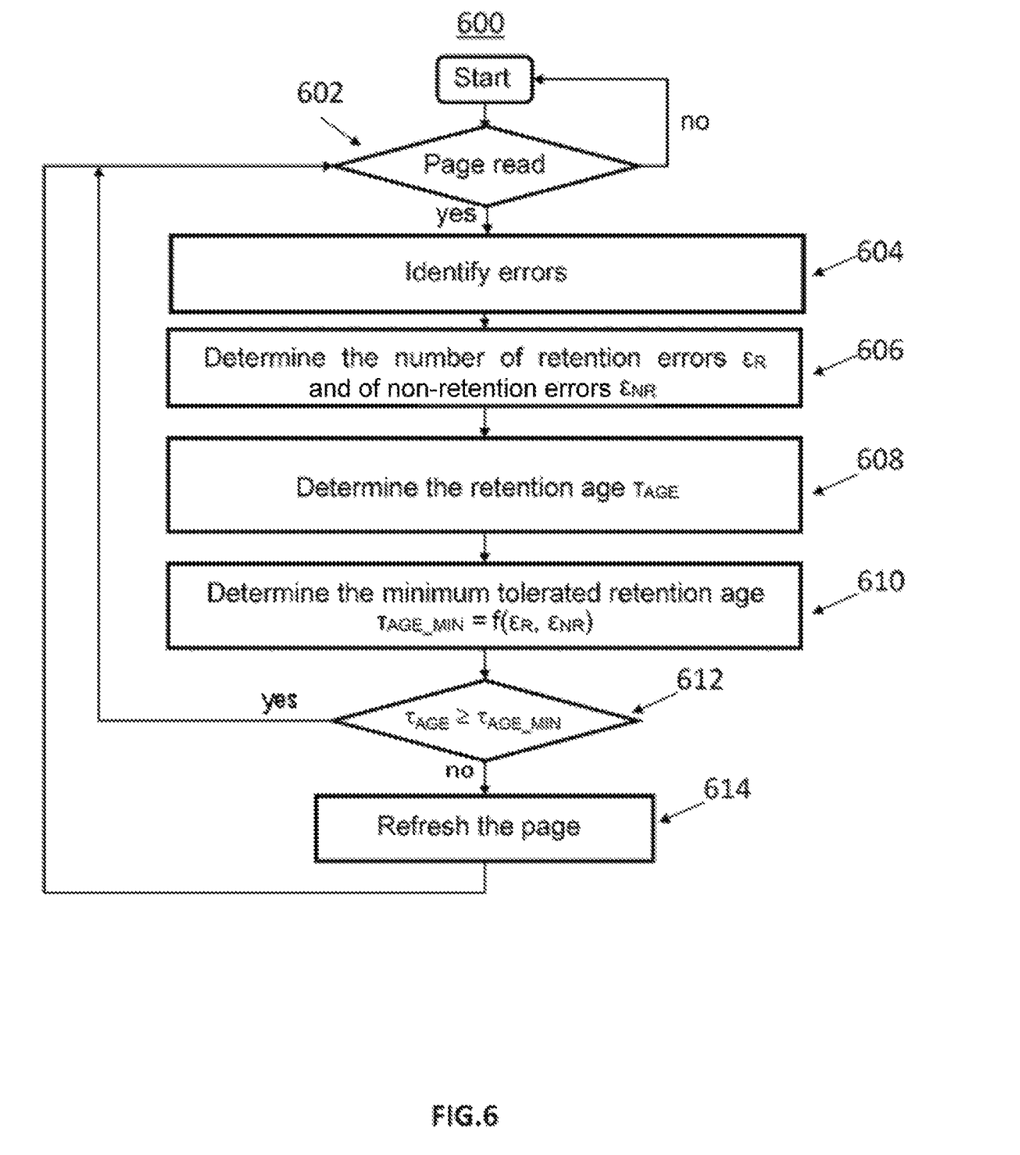
FIG. 6 illustrates a sequence of steps of the method of the invention according to another variant embodiment.

FIG. 6 illustrates a sequence of steps 600 of the method of the invention in the variant embodiment with use of the parameter minimum tolerated retention age $\tau_{AGE\_MIN}$. The method starts with steps 602 to 608 that are identical to steps 402 to 408 of the method of FIG. 4. They are not described again.

In the following step 610, the method allows a minimum tolerated retention age $\tau_{AGE\_MIN}$ to be obtained for a page. The value of the parameter $\tau_{AGE\_MIN}$ may be computed online or preferably it may be obtained from the estimation table of the minimum tolerated retention age.

In the following step 612, the method allows the retention age $\tau_{AGE}$ computed in step 608 to be compared to the minimum tolerated retention age $\tau_{AGE\_MIN}$.

A retention age $\tau_{AGE}$ below the minimum tolerated retention age $\tau_{AGE\_MIN}$ means that the number of errors that may be accumulated until the next operation of reading the page risks becoming uncorrectable. The method then allows the page to be refreshed (step 614). After the refresh operation, the method returns to the start.

A retention age $\tau_{AGE}$ higher than or equal to the minimum tolerated retention age $\tau_{AGE\_MIN}$ means that there is no need for a refresh of the data, and the method returns to the start (yes branch).

Thus, the present description illustrates a preferred implementation of the invention, but is nonlimiting. Examples have been given in order to allow a good comprehension of the principles of the invention and a concrete application, but they are in no way exhaustive and those skilled in the art will be able to make modifications and construct variants of implementation while keeping to the same principles.

The invention may be implemented using hardware and/or software elements. It may be available in the form of a computer-program product that is executed by a dedicated processor or by a memory controller of a storage system, and that contains instructions for executing the steps of various embodiments of these methods.

The invention claimed is:

1. A method for controlling the refresh of data in reprogrammable nonvolatile memories, said memories comprising a plurality of memory pages for storing data, the steps of the method being executed during an operation of reading a memory page and comprising:
    identifying with an error correction code errors in a read memory page;
    computing among the identified errors the number of retention errors and of non-retention errors, the non-retention errors especially comprising repeated read or programming errors;
    computing the retention age of said read memory page;
    estimating the remaining retention time for said read memory page depending on the parameters number of retention errors, number of non-retention errors and retention age computed beforehand;

comparing the estimated value of the remaining retention time to a predefined value corresponding to a maximum time interval between two successive operations of reading a memory page; and determining whether said read memory page must be refreshed or not depending on the results of the comparison.

2. The method as claimed in claim 1, wherein the step of determining whether to refresh the page consists in determining that the page must be refreshed if the remaining retention time is below the predefined value.

3. The method as claimed in claim 1, wherein the step of estimating the remaining retention time comprises at least one step consisting in using a statistical distribution on the parameters number of retention errors, number of non-retention errors and retention age.

4. The method as claimed in claim 3, wherein the statistical distribution is the chi-squared distribution.

5. The method as claimed in claim 1, wherein the step of estimating the remaining retention time consists in obtaining a value of a maximum tolerated number of retention errors for said page; the comparing step consists in comparing the maximum tolerated number of retention errors to the computed number of retention errors; and the step of determining whether to refresh consists in determining that said page must be refreshed if the computed number of retention errors is above the maximum tolerated number of retention errors.

6. The method as claimed in claim 5, wherein the maximum tolerated number of retention errors corresponds to the highest value of the number of retention errors for which the remaining retention time is above said predefined value.

7. The method as claimed in claim 1, wherein the step of estimating the remaining retention time consists in obtaining a value of a minimum tolerated retention age for said page; the comparing step consists in comparing the minimum tolerated retention age to the computed retention age; and the step of determining whether to refresh consists in determining that said page must be refreshed if the computed retention age is below the minimum tolerated retention age.

8. The method as claimed in claim 7, wherein the minimum tolerated retention age corresponds to the lowest retention age for which the remaining retention time is above said predefined value.

9. The method as claimed in claim 1, wherein the step of estimating the remaining retention time consists in reading a table of values precomputed for combinations of the parameters number of retention errors, number of non-retention errors and retention age, and consists in selecting a stored value for the number of retention errors, the number of non-retention errors and the retention age computed for said page.

10. The method as claimed in claim 9, wherein the selected value is a remaining retention time.

11. The method as claimed in claim 9, wherein the selected value is a maximum tolerated number of retention errors.

12. The method as claimed in claim 9, wherein the selected value is a minimum tolerated retention age.

13. The method as claimed in claim 9, wherein the table of precomputed values contains binary values representative of results of the comparison of the remaining retention time with said predefined value, or of results of the comparison of the number of retention errors with the maximum tolerated number of retention errors, or of results of the comparison of retention age with the minimum tolerated retention age.

14. The method as claimed in claim 1, wherein the step of computing the retention age of said at least one memory page consists in reading a timestamp associated with said page and in taking the difference between the state of a counter having provided timestamps to the memory pages and the timestamp read for said page.

15. A computer program containing code instructions for executing steps of the method for controlling the refresh of data in reprogrammable nonvolatile memories as claimed in claim 1, when said program is executed by a processor.

16. A processor-readable storage medium on which is stored a computer program as claimed in claim 15.

17. A device for controlling the refresh of data in reprogrammable nonvolatile memories, said memories comprising a plurality of memory pages for storing data, the device comprising:

an error correction code having a predefined error correction capability;

a circuit for identifying, with the error correction code, errors made during the storage of data in a memory page;

a circuit suitable for computing, among identified errors, the number of retention errors and of non-retention errors in said memory page, the non-retention errors especially comprising repeated read or programming errors;

a circuit suitable for computing the retention age of said memory page;

a circuit suitable for estimating the remaining retention time for said memory page depending on the parameters number of retention errors, number of non-retention errors and retention age computed beforehand;

a circuit suitable for comparing the estimated value of the remaining retention time to a predefined value corresponding to a maximum time interval between two successive operations of reading a memory page; and a circuit suitable for determining whether said memory page must be refreshed or not depending on the result of the comparison.

18. The device as claimed in claim 17, in addition comprising a circuit suitable for refreshing said page.

19. A system for storing data comprising at least one reprogrammable nonvolatile memory having a plurality of memory pages for storing data, and at least one device as claimed in claim 17 for controlling the refresh of data in said at least one reprogrammable nonvolatile memory.

20. The system for storing data as claimed in claim 19, wherein said at least one device is integrated into a controller suitable for managing the read and write operations of the plurality of pages.

21. A device for controlling the refresh of data in reprogrammable nonvolatile memories, said memories comprising a plurality of memory pages for storing data, the device comprising:

an error correction code having a predefined error correction capability;

a circuit for identifying, with the error correction code, errors made during the storage of data in a memory page;

a circuit suitable for computing, among identified errors, the number of retention errors and of non-retention errors in said memory page, the non-retention errors especially comprising repeated read or programming errors;

a circuit suitable for computing the retention age of said memory page;

a circuit suitable for estimating the remaining retention time for said memory page depending on the parameters number of retention errors, number of non-retention errors and retention age computed beforehand;

a circuit suitable for comparing the estimated value of the remaining retention time to a predefined value corresponding to a maximum time interval between two successive operations of reading a memory page; and a circuit suitable for determining whether said memory page must be refreshed or not depending on the result of the comparison, further comprising means for implementing the method as claimed in claim 1.

* * * * *